United States Patent
Sugiyama et al.

(10) Patent No.: US 8,878,213 B2
(45) Date of Patent: Nov. 4, 2014

(54) SEMICONDUCTOR LIGHT EMITTING DEVICE

(75) Inventors: Naoharu Sugiyama, Kanagawa-ken (JP); Tomonari Shioda, Kanagawa-ken (JP); Shigeya Kimura, Kanagawa-ken (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 13/220,072

(22) Filed: Aug. 29, 2011

(65) Prior Publication Data

US 2012/0292650 A1    Nov. 22, 2012

(30) Foreign Application Priority Data

May 16, 2011   (JP) .................. 2011-109852

(51) Int. Cl.
*H01L 33/00* (2010.01)
*H01L 33/42* (2010.01)
*H01L 33/22* (2010.01)
*H01L 33/08* (2010.01)

(52) U.S. Cl.
CPC ........... *H01L 33/22* (2013.01); *H01L 33/42* (2013.01); *H01L 33/08* (2013.01)
USPC 257/98; 257/99; 257/E33.001; 257/E33.006; 257/E33.013; 257/E33.025; 438/29; 438/49

(58) Field of Classification Search
None
See application file for complete search history.

(56) References Cited

U.S. PATENT DOCUMENTS

| | | | |
|---|---|---|---|
| 7,262,436 B2 * | 8/2007 | Kondoh et al. | 257/94 |
| 7,791,090 B2 | 9/2010 | Lester et al. | |
| 2005/0156189 A1 * | 7/2005 | Deguchi et al. | 257/103 |
| 2007/0018187 A1 * | 1/2007 | Lee et al. | 257/98 |
| 2009/0101928 A1 * | 4/2009 | Kim et al. | 257/98 |

FOREIGN PATENT DOCUMENTS

| | | |
|---|---|---|
| JP | 10-69984 | 3/1998 |
| JP | 2000-196152 | 7/2000 |
| JP | 2001-313422 | 11/2001 |
| JP | 2002-353503 | 12/2002 |
| JP | 2004-193338 | 7/2004 |
| JP | 2005-123489 | 5/2005 |
| JP | 2005-183930 | 7/2005 |
| JP | 2006-245163 | 9/2006 |
| JP | 2007-180504 | 7/2007 |
| JP | 2007-214384 | 8/2007 |

(Continued)

OTHER PUBLICATIONS

Japanese Office Action issued Nov. 15, 2011, in Patent Application No. 2011-109852 (with English-language translation).

(Continued)

*Primary Examiner* — Yasser A Abdelaziez
(74) *Attorney, Agent, or Firm* — Oblon, Spivak, McClelland, Maier & Neustadt, L.L.P.

(57) ABSTRACT

According to one embodiment, a semiconductor light emitting device includes an n-type layer, a light emitting layer, a p-type layer, and a transparent electrode. The n-type layer includes a nitride semiconductor and has a thickness not more than 500 nm. The light emitting layer is provided on the n-type layer. The p-type layer is provided on the light emitting layer and includes a nitride semiconductor. The transparent electrode contacts the n-type layer. The n-type layer is disposed between the transparent electrode and the light emitting layer.

18 Claims, 3 Drawing Sheets

(56) References Cited

FOREIGN PATENT DOCUMENTS

| JP | 2008-47861 | 2/2008 |
| JP | 2008-53425 | 3/2008 |
| JP | 2009-94089 | 4/2009 |
| JP | 2010-67891 | 3/2010 |

OTHER PUBLICATIONS

Office Action issued Feb. 28, 2012, in Japanese Patent Application No. 2011-109852 with English translation.

* cited by examiner

US 8,878,213 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2011-109852, filed on May 16, 2011; the entire contents of which are incorporated herein by reference.

FIELD

Embodiments described herein relate generally to a semiconductor light emitting device.

BACKGROUND

A compound semiconductor is used in various fields, such as a fast electronic device represented by a high-frequency device and an optical device represented by light emitting/light receiving devices, and high-performance devices are put to practical use.

However, when a compound semiconductor crystal is formed on a sapphire substrate or silicon substrate excellent in mass production, there may occur problems of the occurrence of pits, occurrence of cracks, loss due to light absorption, etc. It is desired to implement a semiconductor light emitting device of high quality and excellent in the light emission characteristics.

DETAILED DESCRIPTION

Figure 1:
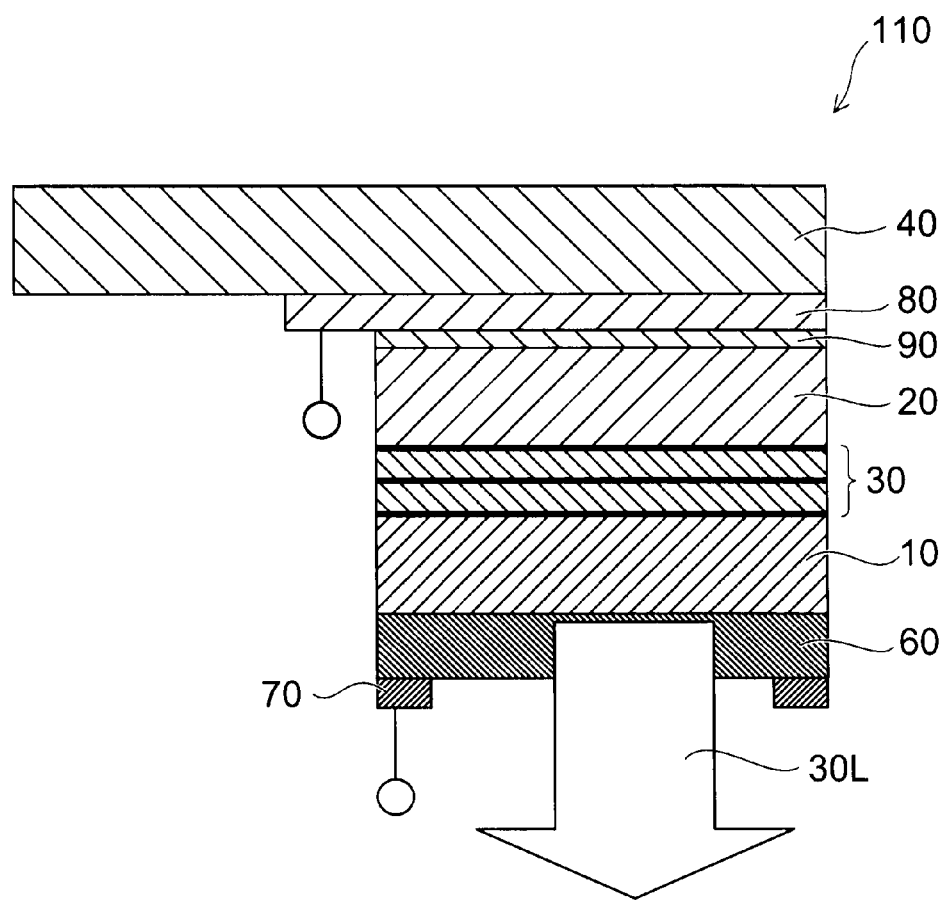
FIG. 1 is a schematic cross-sectional view showing a semiconductor light emitting device according to an embodiment.

In general, according to one embodiment, a semiconductor light emitting device includes an n-type layer, a light emitting layer, a p-type layer, and a transparent electrode. The n-type layer includes a nitride semiconductor and has a thickness not more than 500 nm. The light emitting layer is provided on the n-type layer. The p-type layer is provided on the light emitting layer and includes a nitride semiconductor. The transparent electrode contacts the n-type layer. The n-type layer is disposed between the transparent electrode and the light emitting layer.

Hereinafter, embodiments will be explained with reference to the drawings. A similar component is denoted by the same reference numeral and detailed explanation will be optionally omitted in each of the drawings.

FIG. 1 is a schematic cross-sectional view showing a semiconductor light emitting device according to an embodiment.

A semiconductor light emitting device 110 according to the embodiment comprises an n-type layer (first semiconductor layer) 10, a p-type layer (second semiconductor layer) 20, an MQW (Multiple Quantum Well) active layer (light emitting layer) 30, a support substrate 40, a transparent electrode 60, a first electrode 70, a second electrode 80, and a reflective metal film 90. Then, in the semiconductor light emitting device 110 according to the embodiment, to an LED stacked structure of the p-type layer 20, the active layer 30, and the n-type layer 10, the transparent electrode 60 having a thickness of 200 nm is joined on the side of the n-type layer 10. As the transparent electrode 60, for example, indium tin oxide (ITO) film etc. is used.

The n-type layer 10 is made of an n-type gallium nitride crystal having a thickness of 500 nm. The n-type layer 10 is doped with Si atoms in a concentration of $1 \times 10^{19}$ (atoms·$cm^{-3}$) as impurities. On the n-type layer 10 contact, a metal thin wire is arranged on the transparent electrode 60 and the n-side electrode (first electrode) 70 is formed. In contrast, on the quantum well structure of a nitride semiconductor, which is formed into the active layer 30, the p-type layer 20 is stacked and the reflective metal film 90 used also as the p-side electrode (second electrode) 80 including silver nickel is formed. The p-type layer 20 is made of a p-type gallium nitride crystal.

Here, the sheet resistance of the 200 nm ITO film is about 10Ω□, substantially equivalent to that of an n-type GaN layer having a carrier concentration of $1 \times 10^{19}$ (atoms·$cm^{-3}$) and having a thickness of 5,000 nm.

In the semiconductor light emitting device 110 according to the embodiment, the thickness of the n-type layer 10 is not more than 500 nm. The thickness of the LED stacked structure of the p-type layer 20, the active layer 30, and the n-type layer 10 is, for example, about not more than 1.3 μm. The distance between the surface of the active layer 30 on the side of the n-type layer 10 and the surface of the n-side electrode 70 on the side of the n-type layer 10 is not more than 800 nm. Light from the active layer 30 is emitted from the major surface (light extraction face) of the n-type layer 10 as an arrow 30L shown in FIG. 1. The transparent electrode 60 has transparency to the light from the active layer 30. That is, the transparent electrode 60 functions as the light extraction part of the semiconductor light emitting device 110.

Here, a reference example is explained. For example, in a light emitting device made of a nitride semiconductor, on a sapphire substrate having a (0001) plane as its surface, a gallium nitride crystal layer similarly having the (0001) plane as its surface is formed and further an active layer including an InGaN thin film crystal layer is combined, and thus, a high-quality light emitting diode having a high light emission efficiency etc. is formed.

The light emitting diode in which a nitride semiconductor crystal layer is stacked on the sapphire uses a structure in which an n-type GaN layer, a quantum well type light emitting layer, and a p-type GaN layer are stacked on the sapphire substrate. Here, the sapphire substrate is substantially transparent to the wavelength band of the blue region and thus a structure (face-up structure) is adopted in many cases, in which a reflective film is formed on the back surface of the sapphire substrate and then light is extracted from the top part of the p-type GaN on the side of the surface. In this case, a thick n-type GaN layer is stacked in order to improve the quality of a GaN crystal grown into a thin film on the sapphire substrate and further to make uniform the electric current distribution from the contact electrode to the active layer. Specifically, there is an example, in which an n-type GaN layer having a thickness of about 5 μm is formed on the sapphire substrate.

In contrast, as another reference example, when a GaN crystal layer is grown on the sapphire substrate, a large amount of dislocation is introduced into the GaN crystal because of a large amount of lattice mismatch between the sapphire crystal and the GaN crystal. When the dislocations are introduced into the GaN crystal, the quality of the active layer (light emitting layer made of multi-quantum well) stacked thereon deteriorates and the light emission characteristics are reduced. Because of this, optimization of the GaN crystal layer growth conditions to reduce the dislocation density is examined in various ways.

However, among others, in an n-type GaN layer that is a GaN crystal doped with Si atoms as impurities, migration of the atoms on the surface during growth is suppressed. Thus the rough surface is hard to be covered and hard to be flattened, and then many pits appear where defects are. Such a phenomenon is remarkable when the thickness of the n-type GaN layer exceeds 2 to 3 μm. Further, when a GaN crystal layer is grown on a Si crystal substrate, which is cheaper alternative than sapphire substrate, the occurrence of cracks during which the temperature is cooled after the growth of the nitride crystal layer is completed at not less than 1,000° C. because of a difference in thermal expansion coefficient between both is problematic. But in this case, the incidence of cracks according to an increase in thickness of the n-type GaN layer frequently happens compared with that of a non-doped GaN layer, and thus it is difficult to obtain a thick n-type GaN layer.

In contrast, as a still another reference example, under the operation conditions with a large electric current to be injected, which is for a higher light output, countermeasures against heat load become important. Because of that, there is an example of adoption of a structure (thin-film structure), in which after the epitaxial growth of an LED structure including a nitride semiconductor on a sapphire substrate, the surface side including a p-type GaN layer is bonded to a support substrate having a high thermal conductivity and the sapphire substrate is removed. In this case, there is a possibility that the end surface of the n-type GaN layer from which the sapphire substrate is removed is exposed to form a light extraction face and a contact surface. In this case, it is made easier to perform new processing, such as forming of a thin wire electrode on a contact surface, compared with the face-up structure, and thus the specifications of the sheet resistance required for the n-type GaN layer are changed.

Further, in this case, as described earlier, the end surface of the n-type GaN layer, from which the sapphire substrate is removed, is commonly formed into a light extraction face, but light absorption and electric resistance in a thick n-type layer are problematic. For example, when it is supposed that a light absorption coefficient (a) of an n-type layer having a doping concentration of $1\times10^{19}$ (atoms·cm$^{-3}$) is 135, light generated from the light emitting layer is estimated to be attenuated about 6.5% in the n-type crystal layer having a thickness of 5 μm.

As described above, the thin-film structure in the reference example has such a problem that light absorption by the thick n-type crystal layer formed to obtain a thin film layer of high quality and having a low sheet resistance on a substrate is large. Further, if the thickness of the n-type GaN layer is much thicker, there is a possibility of the occurrence of pits and cracks.

In contrast to this, in the semiconductor light emitting device 110 according to the embodiment, the thickness of the n-type layer 10 is not more than 500 nm. As a result of the examination of the inventors of the invention, when the active layer 30 emits light having a wavelength of, for example, 400 nm, the light emitted from the active layer 30 is attenuated about 0.65% in the n-type layer 10. The light emitted from active layer 30 is attenuated about 5.8% in the transparent electrode 60 having a thickness of 200 nm (when the light absorption coefficient (a) of the transparent electrode is supposed to be 3,000). That is, the attenuation factor of a combination of the n-type layer 10 and the transparent electrode 60 is about 6.45%. This attenuation factor is lower than the attenuation factor (about 6.5%) in the thick n-type crystal layer in the reference example.

Further, if the thickness of the n-type layer 10 is reduced to not more than 500 nm, it is possible to suppress the occurrence of pits and cracks. Further, other advantages those the epitaxial growth time can be reduced etc. are obtained. Because of the above, the semiconductor light emitting device 110 according to the embodiment is of high quality and excellent in the light emission characteristics.

Next, an example of a process for fabricating such a semiconductor light emitting device is explained.

As a substrate, a sapphire substrate having a (0001) plane as its surface is prepared. The substrate is not limited to the sapphire substrate and may be a silicon substrate. The thickness of a sapphire substrate crystal is 450 μm. After cleaning the sapphire substrate by acid treatment, the sample substrate is introduce into the MOCVD (the vapor deposition method using an organic metal) apparatus, the temperature of the substrate is raised up to 500° C., and then, a 20 nm gallium nitride layer is formed using TMG (trimethyl gallium) and NH$_3$ (ammonia) as source materials.

After that, the temperature of the substrate is raised to 1,080° C. Subsequently, at 1,080° C., a 4 μm gallium nitride layer is formed using TMG (trimethyl gallium) and NH$_3$ (ammonia) as source materials. By the growth of the GaN crystal layer not containing impurities, it is possible to form a flat crystal layer without pits. Further, a gallium layer (the n-type layer 10) to which silicon atoms in a concentration of $1\times10^{19}$ (atoms·cm$^{-3}$) are doped as impurities is stacked 0.5 μm thick thereon. As the source material to dope silicon, a silane gas is used. At this time, when the thickness of the n-type GaN layer is thicker, the possibility of the occurrence of pits becomes higher, but when the thickness is not more than 1 μm, its risk is low. On the n-type gallium nitride crystal layer, a light emitting layer (the active layer 30) including a multilayer film of InGaN and GaN is stacked. Further to inject an electric current to cause the light emitting layer (the active layer 30) to emit light, the top part side of the crystal structure is p-type (Mg)-doped.

In the embodiment, the technique for growing a thin film crystal of a nitride semiconductor crystal layer includes the vapor deposition method using an organic metal (MOCVD method), but it may also be possible to use any of the molecular beam epitaxy (MBE) method, which is a thin film crystal growth method used generally for the nitride semiconductor crystal growth, and the hydride vapor phase epitaxy (HVPE) method.

After the epitaxial growth of a thin film crystal having an LED structure as described above, the support substrate 40 made of silicon, copper, etc., is bonded to the surface of the p-type layer 20 after a metal film including Ag, for example, a silver nickel layer, is stacked as a reflective film and also as a contact layer.

Next, the sapphire substrate, which is the substrate for thin film crystal growth, is removed. As a removal method, a method called laser lift-off (LLO) that damages only the partial portion in the vicinity of the boundary surface by irradiating the boundary surface of the sapphire substrate and the nitride semiconductor layer with focused laser light is used. Then, the exposed GaN crystal layer not containing impurities is further etched and the n-type GaN layer is left 500 nm thick. After that, a 200 nm ITO film (the transparent electrode 60) is stacked and further, a thin wire electrode is formed. In this manner, the semiconductor light emitting device 110 according to the embodiment is formed.

In the process described earlier, the 4 μm GaN layer not containing impurities and the 500 nm n-type GaN layer to which silicon atoms are doped as impurities are stacked and after the laser lift-off, the exposed GaN layer not containing impurities is etched, and thus the n-type layer 10 having a thickness of 500 nm is formed, but the procedure is not limited as this. For example, it may also be possible to form only the 500 nm n-type GaN layer in the process of the thin film growth of a GaN layer to be formed directly, for example, on the sapphire substrate. Further, for example, after the n-type layer 10 having a thickness not less than 500 nm is formed on the sapphire substrate and the sapphire substrate is removed, the n-type layer 10 having a thickness not more than 500 nm may also be formed.

Further, the nitride semiconductor layer may have an n-type layer made of a nitride semiconductor containing an impurity. For example, the nitride semiconductor layer may have a nitride semiconductor layer not containing an impurity; and an n-type layer made of the nitride semiconductor containing an impurity.

Next, another embodiment is explained.

Figure 2:
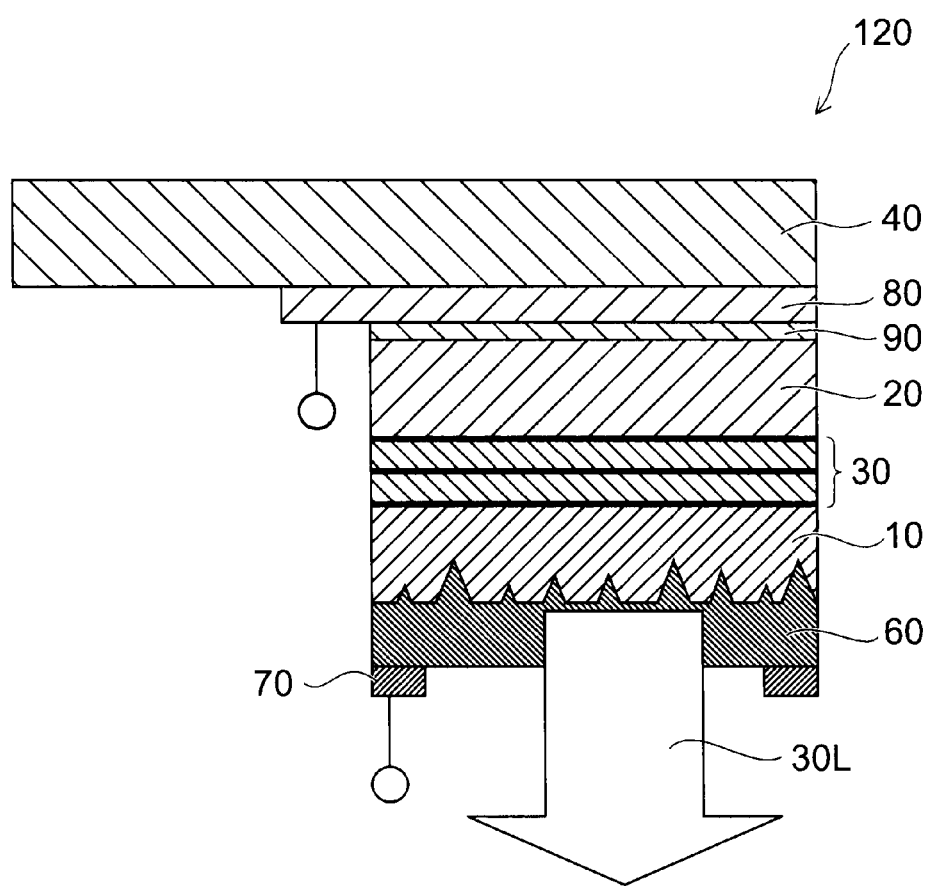
FIG. 2 is a schematic cross-sectional view showing a semiconductor light emitting device according to another embodiment.

FIG. 2 is a schematic cross-sectional view showing a semiconductor light emitting device according to another embodiment.

A semiconductor light emitting device 120 according to the embodiment uses an LED stacked structure of the p-type layer 20, the active layer 30, and the n-type layer 10. The n-type layer 10 is made of an n-type gallium nitride crystal having an average thickness of 600 nm. On the surface (light extraction face) of the n-type GaN layer (the n-type layer 10), processing to form concave-convex shape having an average concave depth of 200 nm is performed. In the specification of the application, the description that the thickness of the n-type layer 10 is "not more than 500 nm" is assumed to include that the value in which the average concave depth on the concave-convex shape provided on the surface of n-type layer 10 is subtracted from the average thickness of the n-type layer 10 is not more than 500 nm. Because of this, the light can be scattered on the light extraction face. On this concave-convex surface, the ITO layer (the transparent electrode 60) is further stacked. The n-type GaN layer is doped with Si atoms in a concentration of $1 \times 10^{19}$ (atoms·cm$^{-3}$) as impurities. On the quantum well structure of the nitride semiconductor, which is formed into the active layer 30, the p-type gallium nitride is stacked and the reflective metal film 90 used also as the p-side electrode (the second electrode) 80 made of silver nickel is formed. Other structures are the same as those of the structure of the semiconductor light emitting device described earlier in relation to FIG. 1.

The concaves-convex surface described earlier can be formed by etching using a KOH solution after removing from the sapphire crystal, which is the growth substrate of the GaN crystal layer, etching the GaN crystal layer not containing impurities, and then exposing the n-type GaN layer. In this manner, the ITO thin film layer (the transparent electrode 60) having a thickness of 200 nm is formed on the surface of concave-convex structure formed by etching by KOH.

Next, another example of the process for forming the semiconductor light emitting device 110 described earlier in relation to FIG. 1 is explained.

Figure 3A:
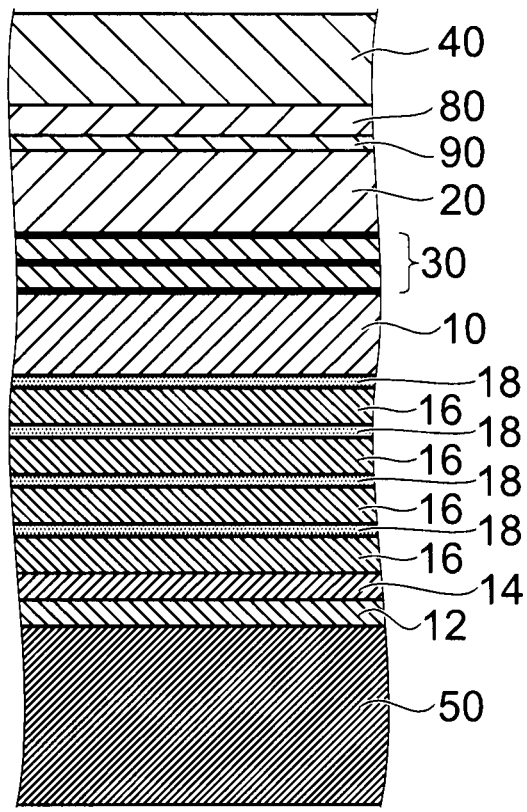
FIGS. 3A and 3B are schematic cross-sectional views for explaining another example of the process.
Figure 3B:
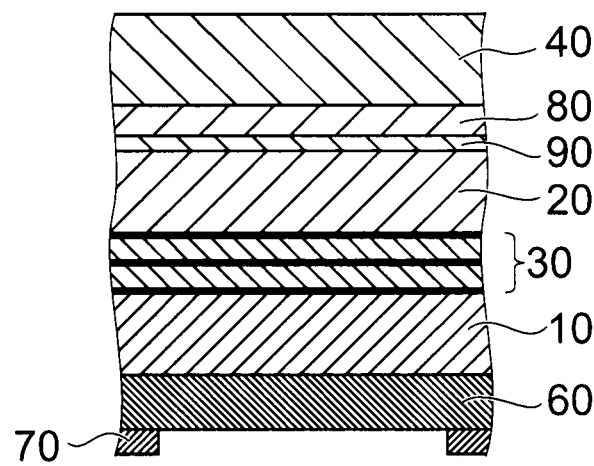

FIGS. 3A and 3B are schematic cross-sectional views for explaining another example of the process.

As shown in FIG. 3A, as a substrate, a Si substrate 50 having a thickness of 500 μm is prepared. The surface orientation of the substrate is (111). In general, the surface of the Si substrate 50 placed in the atmosphere is covered with a native oxide film. Because of that, the sample substrate is treated by a diluted hydrofluoric acid in a concentration of about 1% for about one minute to remove the native oxide film and to perform hydrogen termination processing on the substrate surface. Because of this processing, the Si layer surface has a surface structure terminated by hydrogen, that is, a water-repellent surface.

Subsequently, a gallium nitride crystal layer (the GaN layer 16) is grown (epitaxially grown) into a thin film crystal on the Si substrate 50 the surface of which has been subjected to hydrogen termination processing as described above. However, in general, the Si crystal easily reacts with the Ga metal and a defective region (Melt-Back region) is formed at the boundary surface. Therefore, in order to avoid this, an AlN thin film crystal layer (first buffer layer 12) is formed on the Si substrate 50, at first.

The sample substrate is introduced into the MOCVD (the vapor deposition method using an organic metal) apparatus, the temperature of the substrate is raised up to 700° C., and a 30 nm aluminum nitride layer is formed using TMA (trimethyl aluminum) and NH$_3$ (ammonia) as source materials. At this time, a hydrogen atom having terminated the surface of the Si substrate desorbes before the start of growth of an AlN layer, and then the surface of Si is exposed. After that, the temperature of the substrate is raised to 1,080° C., TMG (trimethyl gallium) is added as a source material, and an AlGaN layer (second buffer layer 14) having an Al composition of 25% and a thickness of 20 nm is stacked.

Further, after that, at 1,120° C., a 0.3 μm gallium nitride layer 16 (first crystal layer) is formed using TMG (trimethyl gallium) and NH$_3$ (ammonia) as source materials. Subsequently, an AlN layer 18 (second crystal layer) having a thickness of 15 nm is stacked at a film formation temperature of 800° C. On the basis of this foundation, the GaN layer 16 having a thickness of 300 nm and the AlN layer 18 having a thickness of 15 nm are stacked for four periods. Impurities are not doped yet to the GaN layer 16, the AlN layer 18 up to now.

By repeating the AlN thin film layer and the GaN layer in this manner, compressive stress can be accumulated in the grown layer and it is possible to suppress the occurrence of cracks in the GaN layer 16 that are caused by a difference in thermal expansion coefficient between the Si crystal and the GaN crystal when the growth temperature is cooled. Further, by adopting a layer not containing impurities as the foundation GaN layer 16, it is possible to suppress the occurrence of cracks despite the fact that the GaN layer having a thickness of 1.2 μm in total for four periods is stacked.

Subsequently, after stacking the AlN layer 18 having a thickness of 15 nm four times, the GaN layer (the n-type layer 10) having a thickness of 500 nm is stacked. To the GaN layer, Si in a concentration of $1 \times 10^{19}$ (atoms·cm$^{-3}$) is doped as impurities. On the n-type gallium nitride crystal layer (the n-type layer 10), the light emitting layer (the active layer 30) including a multilayer film of InGaN and GaN is stacked.

Further, in order to inject an electric current to cause the light emitting layer to emit light, the upper part side of the crystal structure is p-type (Mg)-doped.

As described earlier in relation to FIG. 1, as the technique to grow a thin film crystal of a nitride semiconductor crystal layer, any of the molecular beam epitaxy (MBE) method, the hydride vapor phase epitaxy (HVPE) method, etc., may be used.

After epitaxial growth of a thin film crystal having an LED structure in this manner, a metal film including Ag, as a reflective film used also as a contact layer, for example, a silver nickel layer, is stacked on the surface of the p-type layer 20, and then, it is bonded to a support substrate made of silicon, copper, etc.

Next, the Si substrate 50, which is the substrate for thin film crystal growth, is removed. It is possible to remove the Si substrate 50 for growth by grinding the growth substrate after bonding the support substrate 40 to the side of the p-type layer 20. At this time, by finally removing the Si layer left slightly by dry etching using a $SF_6$ gas as an etchant, after removing most of the Si substrate 50 by grinding, it is possible to expose the AlN layer (the first buffer layer 12) formed first on the Si substrate 50.

After that, as shown in FIG. 3B, the exposed thin film AlN layer and the GaN layer 16 and the AlN layer 18 for four periods, not containing impurities are further etched and the 500 nm n-type GaN layer (the n-type layer 10) is left. After that, a 200 nm ITO film (the transparent electrode 60) is stacked and the thin wire electrode is formed further.

As described earlier in relation to FIG. 1, for example, after a GaN layer (the n-type layer 10) having a thickness not less than 500 nm is stacked and the Si substrate 50, which is the substrate for film crystal growth, is removed, the n-type layer 10 having a thickness not more than 500 nm may also be formed.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements incorporated unintentionally.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as active layers, semiconductor layer, transparent electrodes, etc., from know art. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
   an n-type layer including a nitride semiconductor and having a thickness not more than 500 nm;
   a light emitting layer provided on the n-type layer;
   a p-type layer provided on the light emitting layer and including a nitride semiconductor; and
   a transparent electrode, the n-type layer being disposed between the transparent electrode and the light emitting layer, wherein the transparent electrode is in direct contact with the n-type layer, and a sheet resistance of the transparent electrode is not more than $10\Omega/\square$,
   wherein the transparent electrode is a layer thinner than the n-type layer.

2. The device according to claim 1, wherein the transparent electrode includes indium tin oxide.

3. The device according to claim 1, wherein an average thickness of the n-type layer is not more than 600 nanometers, and a surface of the n-type layer on an opposite to the light emitting layer has a concave-convex shape, an average concave depth of the concave-convex shape is not more than 200 nanometers, and the light emitted from light emitting layer is scattered at the concave-convex structure.

4. The device according to claim 1, wherein a total thickness of the n-type layer, the light emitting layer, and the p-type layer is not more than 800 nm.

5. The device according to claim 1, wherein a metal thin wire is provided on the transparent electrode.

6. The device according to claim 1, further comprising:
   a first electrode, the transparent electrode being disposed between the first electrode and the n-type layer, the first electrode contacting the transparent electrode;
   a reflective film provided on the p-type layer; and
   a second electrode provided on the reflective film.

7. The device according to claim 6, wherein a distance between a surface of the light emitting layer on a side of the n-type layer and a surface of the first electrode on a side of the n-type layer is not more than 800 nanometers.

8. The device according to claim 6, wherein the reflective film includes silver.

9. The device according to claim 1, wherein the n-type layer includes a gallium nitride.

10. The device according to claim 1, wherein the p-type layer includes a gallium nitride.

11. The device according to claim 3, wherein the n-type layer includes a gallium nitride.

12. The device according to claim 3, wherein the p-type layer includes a gallium nitride.

13. The device according to claim 3, wherein the n-type layer has an irregular concave-convex shape, the irregular concave-convex shape including an incline.

14. The device according to claim 3, wherein the transparent electrode contacts the surface of the n-type layer on an opposite to the light emitting layer and has transparency to light emitted from the light emitting layer, and a thickness of the transparent electrode is equal to the average concave depth.

15. The device according to claim 14, wherein the transparent electrode includes indium tin oxide.

16. The device according to claim 14, wherein a sheet resistance of the transparent electrode is not more than $10\Omega/\square$.

17. The device according to claim 1, wherein the transparent electrode is in direct and continuous contact with the n-type layer.

18. A semiconductor light emitting device comprising:
   an n-type layer including a nitride semiconductor and having a thickness not more than 500 nm;
   a light emitting layer provided on the n-type layer;
   a p-type layer provided on the light emitting layer and including a nitride semiconductor; and a transparent electrode, the n-type layer being disposed between the transparent electrode and the light emitting layer, an attenuation factor of the n-type layer for the light emitted from the light emitting layer being 0.65%, and an attenuation factor of the transparent electrode for the light emitted from the light emitting layer being 5.8%.

* * * * *